United States Patent
Beaulieu

(10) Patent No.: US 6,466,068 B2
(45) Date of Patent: *Oct. 15, 2002

(54) PHASE LOCKED LOOP HAVING DC BIAS CIRCUITRY

(75) Inventor: Rejean Beaulieu, Mercier (CA)

(73) Assignee: Marconi Communications, Inc., Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,590

(22) Filed: Aug. 30, 2001

(65) Prior Publication Data

US 2002/0030519 A1 Mar. 14, 2002

Related U.S. Application Data

(63) Continuation of application No. 09/618,882, filed on Jul. 19, 2000, now Pat. No. 6,304,115.

(51) Int. Cl.[7] .............................. H03L 7/06
(52) U.S. Cl. ........................ 327/156; 327/159
(58) Field of Search ........................ 327/145–150, 327/155–159, 162, 163; 331/17; 375/373–375

(56) References Cited

U.S. PATENT DOCUMENTS 5,254,955 A * 10/1993 Saeki et al. ............... 327/105
5,754,598 A * 5/1998 Barrett et al. ............. 327/159
5,920,233 A * 7/1999 Denny ....................... 331/114
6,043,695 A * 3/2000 O'Sullivan ................. 327/156

\* cited by examiner

Primary Examiner—My-Trang Nuton
(74) Attorney, Agent, or Firm—Jones, Day, Reavis & Pogue

(57) ABSTRACT

A phase locked loop is provided that includes a phase detector, an integrator, a voltage controlled oscillator and a feedback circuit. The phase detector is coupled to a reference clock signal and a feedback signal, and generates positive and negative phase detection signals that correspond to the phase difference between the reference clock signal and the feedback signal. The integrator is coupled to the positive and negative phase detection signals, and converts the positive and negative phase detection signals into an output voltage that is proportional to the phase difference between the reference clock signal and the feedback signal. The voltage controlled oscillator is coupled to the output voltage of the integrator, and generates a local oscillator signal with an oscillation frequency that is proportional to the output voltage of the integrator. The feedback circuit is coupled to the local oscillator signal, and shifts the phase of the local oscillator signal to generate the feedback signal. The phase locked loop locks with a continues phase error between the feedback signal and the reference signal that is substantially equivalent to an integer multiple of the period of the local oscillator signal.

15 Claims, 3 Drawing Sheets

PHASE LOCKED LOOP HAVING DC BIAS CIRCUITRY

CROSS-REFERENCE TO RELATED APPLICATION

This application is a continuation of U.S. application Ser. No. 09/618,882, now U.S. Pat. No. 6,304,115, filed Jul. 19, 2000.

BACKGROUND OF THE INVENTION

1. Technical Field

The present invention is directed to the field of phase locked loops. More specifically, the invention provides an improved phase locked loop ("PLL") that includes a DC bias circuit. The DC bias circuit enables the PLL to operate using a single supply voltage, and also may be used to eliminate the phase discrimination "dead zone" normally associated with the phase detector element of the PLL.

2. Description of the Related Art

Phase locked loops are well-known elements in analog and digital circuit design. A phase locked loop operates by receiving an external reference clock signal and generating a localized oscillator signal that is synchronized with the external reference clock signal. The local oscillator signal may operate at the same frequency as the reference clock signal or at some integer multiple of that frequency. A general description of the theory and operational characteristics of a PLL is contained in Couch, *Digital and Analog Communication Systems,* Fourth Edition, pp. 289–296.

FIG. 1 is a circuit diagram of a known PLL circuit 10. This circuit 10 includes four primary elements—a phase detector 14, an operational amplifier 26, a voltage controlled oscillator (VCXO) 32, and a counter 36. This circuit 10 generates a local oscillator signal (PLL clock) 34 that is synchronized with an external reference clock signal 12, but which operates at a higher frequency than the external reference clock 12. This is accomplished by feeding back a divided down version 38 of the local oscillator signal 34 to the phase detector 14, which then compares the phases of the reference clock signal 12 with the feedback signal 38.

The phase detector 14 is preferably a phase frequency detector, and has two inputs and two outputs. The two inputs of the phase detector 14 are coupled to the external reference clock signal 12 and the PLL feedback signal 38, and the two outputs 16A, 16B are coupled to the operational amplifier 26. If the PLL feedback signal 38 leads in phase with respect to the reference clock signal 12, then the phase detector 14 outputs a pulse on the negative phase output (ph−) 16A. Similarly, if the reference clock signal 12 leads in phase with respect to the PLL feedback signal 38, then the phase detector 14 outputs a pulse on the positive phase output (ph+) 16B. These output pulses on the positive and negative phase outputs 16A, 16B from the phase detector 14 are characterized by a pulse width that is equivalent to the phase difference between the two inputs.

When the phase difference between the reference clock signal 12 and the PLL feedback signal 38 is nearly zero degrees (i.e., when the PLL is "locked"), then the phase detector enters an operational region in which it cannot discriminate the phase difference between the two input signals. This operational region is referred to herein as the "dead zone." As the phase difference of the two inputs approaches zero degrees, the phase detector 14 outputs minimum-width pulses on both the positive and negative phase outputs 16A, 16B.

The phase detector outputs 16A, 16B are coupled to the operational amplifier 26 through a pair of RC circuits. These RC circuits configure the operational amplifier 26 as an integrator. The negative phase output (ph−) 16A is coupled to the negative input of the operational amplifier 26 through the RC circuit composed of resistors 18, 28 and capacitor 30. And the positive phase output (ph+) 16B is coupled to the positive input of the operational amplifier 26 through the RC circuit composed of resistors 20, 22 and capacitor 24.

This integrator 18–30 receives the pulses from the phase detector outputs (ph+, ph−) 16A, 16B and generates a voltage level at its output that is proportional to the pulse width of the phase pulses. This phase voltage is then provided as an input to the voltage controlled oscillator (VCXO) 32. Because these phase pulses are typically very narrow, particularly when the reference clock signal 12 is very nearly in phase with the PLL feedback signal 38, the voltage output of the operational amplifier is typically near ground. For this reason, the operational amplifier 26 is typically powered using two power supply voltages, such as +/−12 volts or +/−15 volts. This is done because the operational amplifier 26 output becomes non-linear as the output voltage approaches the power supply rails. Thus, it does not operate effectively from a single supply voltage, such as +5V, where the other supply rail is ground, since the phase voltage is typically very close to ground when the PLL is in the locked condition.

The voltage controlled oscillator 32 generates an output clock signal, PLL clock 34, which is characterized by a frequency that is proportional to the phase voltage from the integrator. This clock signal, PLL clock 34, is the localized oscillator signal that is synchronized with the external reference clock 12. The PLL clock signal 34 is then fed back to one of the inputs of the phase detector 14 either directly, or via a counter 36.

The counter 36 is configured as a divide-by-N counter, and it generates the PLL feedback signal 38, which is a frequency divided version of the PLL clock signal 34. By selecting an appropriate value of N, a circuit designer can select the frequency of the PLL clock signal 34 with respect to the external reference clock 12. For example, if the circuit designer desires to generate a synchronized version of the reference clock signal 12, but at a frequency 10 times greater than the reference clock signal 12, then the value of N would be 10.

FIG. 2 is a timing diagram showing the operation of the PLL set forth in FIG. 1. This timing diagram sets forth, from top to bottom, the PLL clock signal 34, the reference clock signal 12, the PLL feedback signal 38, and the corresponding phase pulse signals on the positive and negative phase outputs 16B, 16A of the phase detector 14. As seen in this diagram, during normal operation (i.e., when the PLL is locked), the PLL clock signal 34 is in phase with the reference clock 12, but at a higher frequency. The PLL feedback signal 38 is nearly identical to the external reference clock signal 12 when the circuit is locked, and is in phase with this signal. When locking occurs, the phase difference between the PLL feedback signal 38 and the reference clock signal 12 is very small, and the phase detector 14 enters the "dead zone" region in which it cannot further discriminate between the phase difference of the two input signals 12, 38. In this region, the phase detector 14 outputs two extremely narrow pulses at the positive and negative phase outputs 16B, 16A, during the rising edge of the input clocks 12, 38.

The circuit shown in FIG. 1 suffers from two problems. The first problem relates to the dead zone. As described above, at some point during the locking of the PLL, the phase difference between the reference clock signal 12 and the feedback signal 38 becomes so small that the phase detector 14 cannot determine which signal is leading or lagging the other signal. This dead zone region thus presents a minimum threshold phase difference below which the PLL cannot properly lock. Although the characteristics of the phase detector circuitry 14 generally determine the extent of the dead zone region, the minimum threshold difference represented by this region may also be affected by component variations and tolerances in the external RC elements 18–24, 28–30 of the integrator.

The second problem with the circuit shown in FIG. 1 relates to the operational amplifier 26 power scheme. As described above, because the positive and negative phase outputs 16A, 16B of the phase detector 14 are typically very narrow pulses, particularly as the PLL approaches a locked condition, the output voltage of the integrator circuit is typically near zero volts (ground). Because of this very small output voltage, and also because an operational amplifier does not exhibit linear characteristics near its power rails, this requires that the operational amplifier 26 is powered using a plus/minus power supply scheme, such as +/−15 volts. This presents a problem when the apparatus in which the PLL circuit 10 is employed includes only a single power supply, such as +5V.

Therefore, there remains a need in this field for an improved PLL circuit that overcomes the problems noted herein.

SUMMARY OF THE INVENTION

A phase locked loop is provided that includes a phase detector, an integrator, a voltage controlled oscillator and a feedback circuit. The phase detector is coupled to a reference clock signal and a feedback signal, and generates positive and negative phase detection signals that correspond to the phase difference between the reference clock signal and the feedback signal. The integrator is coupled to the positive and negative phase detection signals, and converts the positive and negative phase detection signals into an output voltage that is proportional to the phase difference between the reference clock signal and the feedback signal. The voltage controlled oscillator is coupled to the output voltage of the integrator, and generates a local oscillator signal with an oscillation frequency that is proportional to the output voltage of the integrator. The feedback circuit is coupled to the local oscillator signal, and shifts the phase of the local oscillator signal to generate the feedback signal. The phase locked loop locks with a continues phase error between the feedback signal and the reference signal that is substantially equivalent to an integer multiple of the period of the local oscillator signal.

DETAILED DESCRIPTION OF THE DRAWINGS

Figure 1:
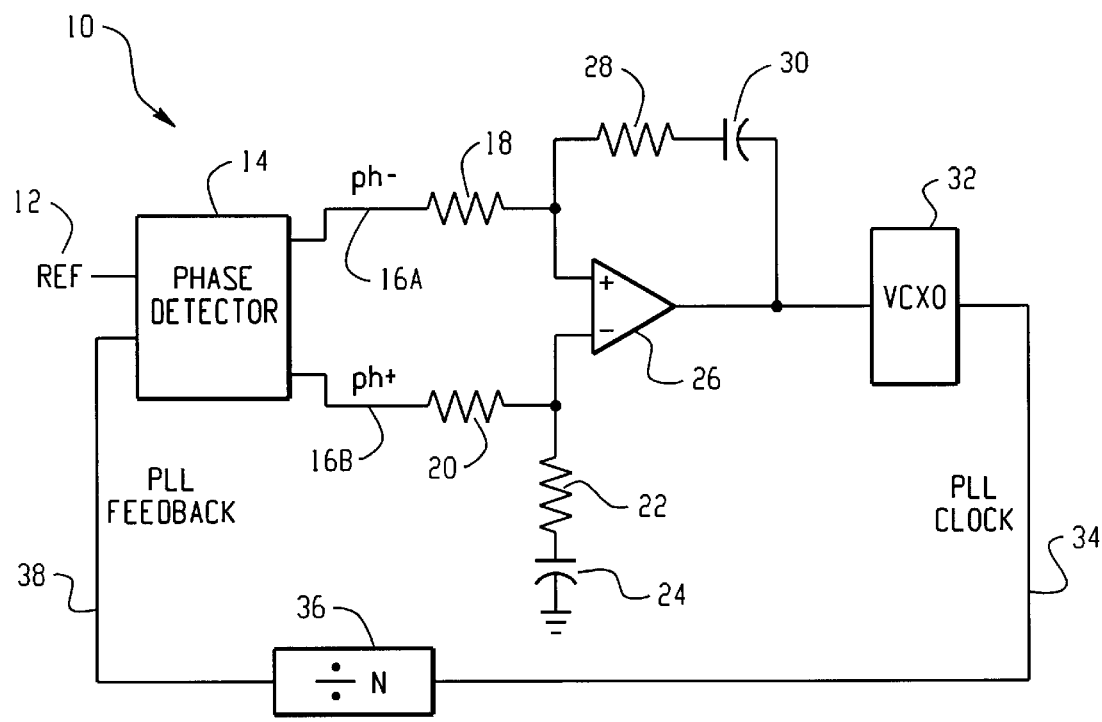
FIG. 1 is a circuit diagram of a known PLL.
Figure 3:
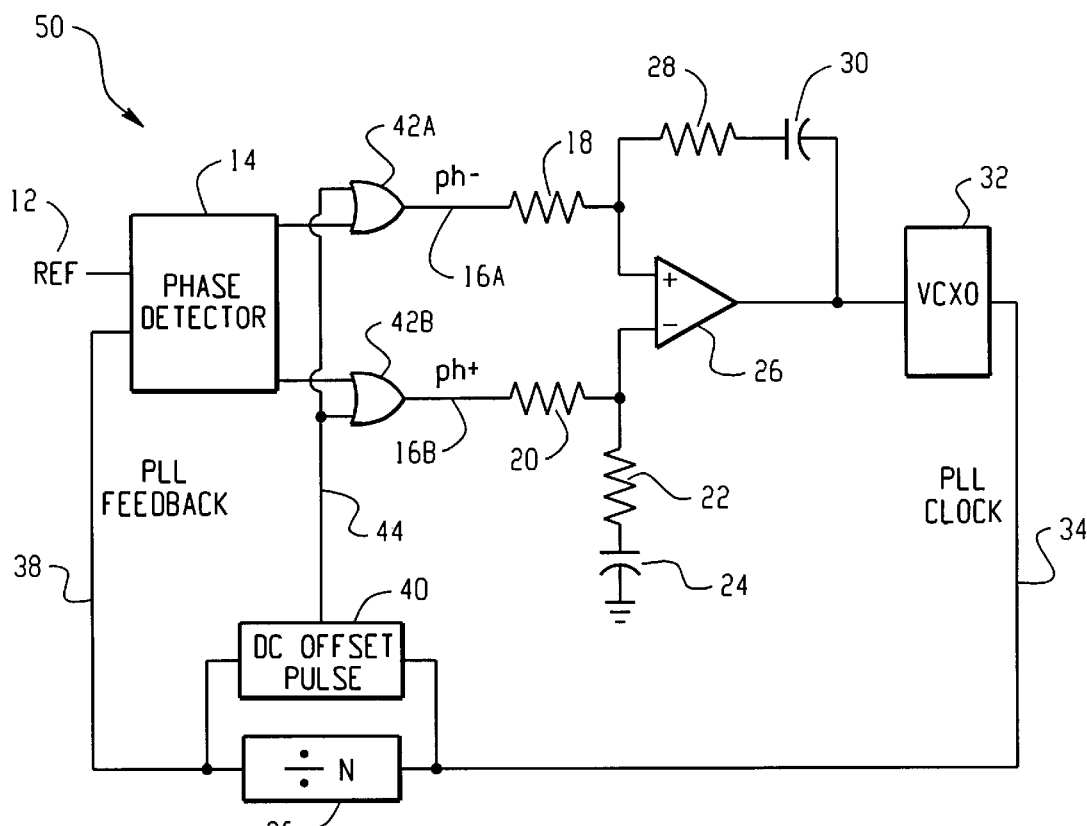
FIG. 3 is a circuit diagram of a first embodiment of a PLL according to the present invention.

Turning now to the remaining drawing figures, FIG. 3 is a circuit diagram of a first embodiment of a PLL circuit 10 according to the present invention. Similar to the circuit shown in FIG. 1, this circuit 10 includes a phase detector 14, an integrator 18–30, a voltage controlled oscillator 32, and a counter 36 configured as a divider. The operation of these elements is similar to that described with reference to FIG. 1. In addition, however, the circuit shown in FIG. 3 includes a DC bias circuit coupled to the forward and feedback paths of the PLL 10. The DC bias circuit is preferably a digitally controlled circuit that includes a DC offset pulse circuit 40 and a pair of OR-gates 42A, 42B.

The DC offset pulse circuit 40 is configured in parallel with the counter 36, and preferably generates a variable-width digital pulse signal 44 that is centered 180 degrees out of phase with the PLL clock signal 34. By configuring the digital pulse signal 44 in this manner, the impact on the phase detector's 14 linearity is minimized. The digital pulse signal 44 is provided to one of the inputs of each of the OR-gates 42A, 42B. Coupled to the other inputs of the respective OR-gates 42A, 42B are the positive and negative phase outputs of the phase detector 14. The OR-gates merge the two signals at their inputs, thus providing an OR function. The outputs of the OR-gates 16A, 16B are therefore the positive and negative phase outputs of the phase detector 14 integrated with the digital pulse signal 44.

One purpose of merging the digital pulse signal 44 with the positive and negative phase outputs 16A, 16B of the phase detector is to polarize the +/− inputs of the operational amplifier 26 of the integrator. As noted above, in the known PLL circuit (as shown in FIG. 1), the operational amplifier requires a +/− power supply scheme in order to provide a linear output signal around zero volts. In the circuit shown in FIG. 3, however, by simultaneously integrating a digital pulse signal 44 into the phase detector outputs, the operational amplifier inputs are polarized (or biased) to a particular DC bias level based upon the width of the digital pulse signal 44. Because of the common-mode rejection ratio of the operational amplifier 26, this common-mode DC bias presented to both inputs of the operational amplifier 26 will essentially be ignored. Thus, the digital pulse signal 44 has no effect on the locking operation of the PLL. Because the operational amplifier 26 inputs have been pre-biased to a particular voltage level above ground, however, the operational amplifier 26 no longer requires a +/− power supply and can operate on a single supply voltage.

For example, a single +5V DC power supply can now be utilized to power the operational amplifier 26. The other power rail of the operational amplifier 26 can then be coupled to ground. By varying the pulse width of the digital pulse signal 44, the operational amplifier can be polarized to a particular voltage level. The amount of polarization is proportional to the width of the digital pulse signal 44 in comparison to the width of the reference clock signal 12. Thus, if the pulse width of the digital pulse signal 44 is half the pulse width of the reference clock signal 12, and the power supply for the operational amplifier is +5V DC, then the operational amplifier inputs will be polarized at +2.5V DC. This digital pulse signal 44 is variable, however, and thus the circuit designer can polarize the operational amplifier 26 inputs to any bias level between the power supply rails, as necessary. This polarization scheme ensures that even for very narrow pulse outputs from the phase detector 14, the operational amplifier 26 is operating in a linear region.

Figure 4:
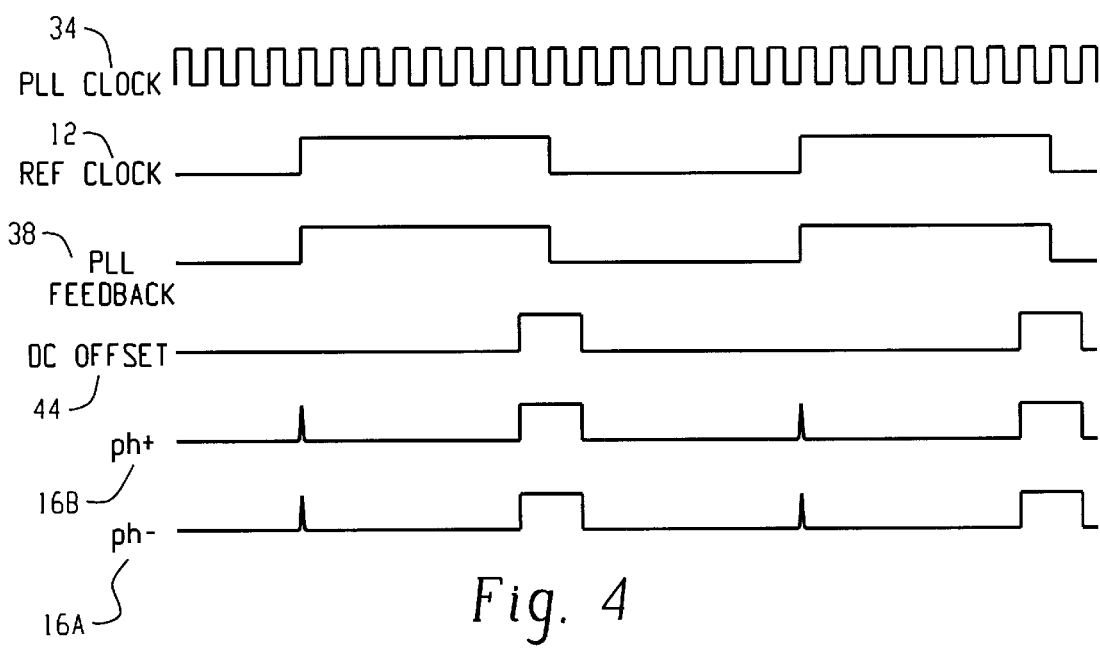
FIG. 4 is a timing diagram showing the operation of the PLL set forth in FIG. 3.

FIG. 4 is a timing diagram showing the operation of the PLL 10 set forth in FIG. 3. This timing diagram shows the PLL clock 24, the external reference clock 12, the PLL feedback signal 38, the digital pulse signal 44 from the DC offset pulse circuit 40, and the positive and negative phase outputs 16A, 16B of the phase detector 14 merged with the digital pulse signal 44 (i.e., the outputs of the two OR-gates 42A, 42B.) This timing diagram is very similar to that shown in FIG. 2, particularly on the rising edge of the reference clock signal 12. Like FIG. 2, this timing diagram depicts the operation of the PLL 10 when it is in the locked condition and the phase difference between the reference clock signal 12 and the PLL feedback signal 38 is minimized. At the rising edge of the external reference clock 38, the phase pulse outputs 16A, 16B are similar to those shown in FIG. 2, and include a minimal pulse output representative of the phase detector being locked but in the dead zone region where it cannot further discriminate the phase difference between the two input signals.

Figure 2:
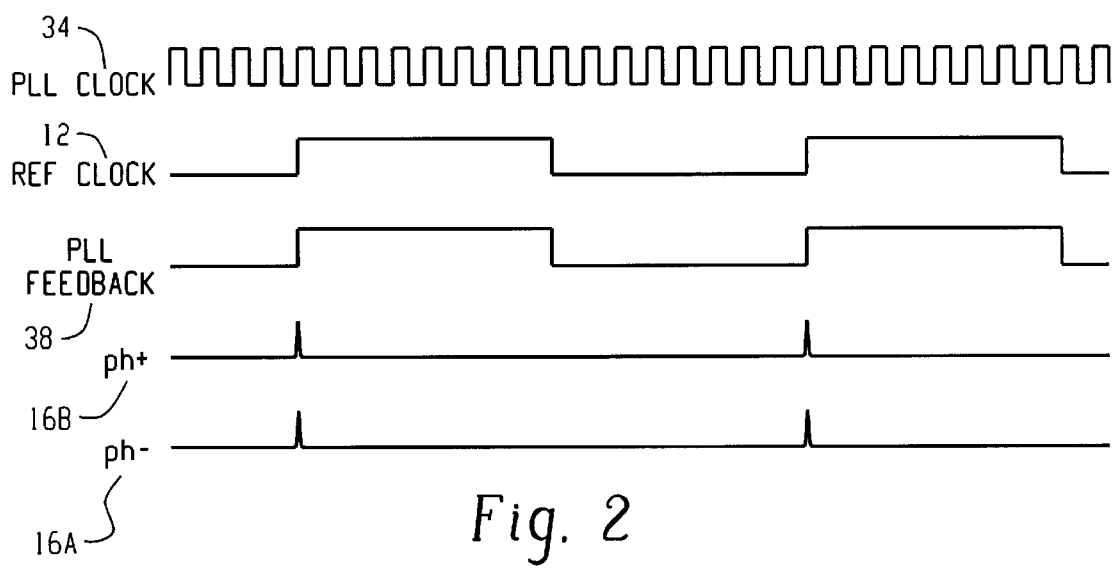
FIG. 2 is a timing diagram showing the operation of the PLL set forth in FIG. 1.

At the falling edge of the external reference clock 12, however, FIG. 4 is substantially different than FIG. 2. Here, instead of simply presenting a ground signal at the phase detector outputs 16A, 16B, the circuit shown in FIG. 3 merges the digital pulse signal 44 with the phase detector outputs in order to generate the polarization levels for the operational amplifier 26. These polarization pulses on 16A, 16B are then coupled to the inputs of the operational amplifier 26 and bias the operational amplifier to a DC voltage level in proportion to the ratio of the pulse width of the digital pulse signal 44 to the pulse width of the reference clock 12. In this manner, the operational amplifier 26 can operate using a single power supply voltage, and yet can linearly integrate the very narrow pulses output from the phase detector 14 on the rising edge of the reference clock 12.

Figure 5:
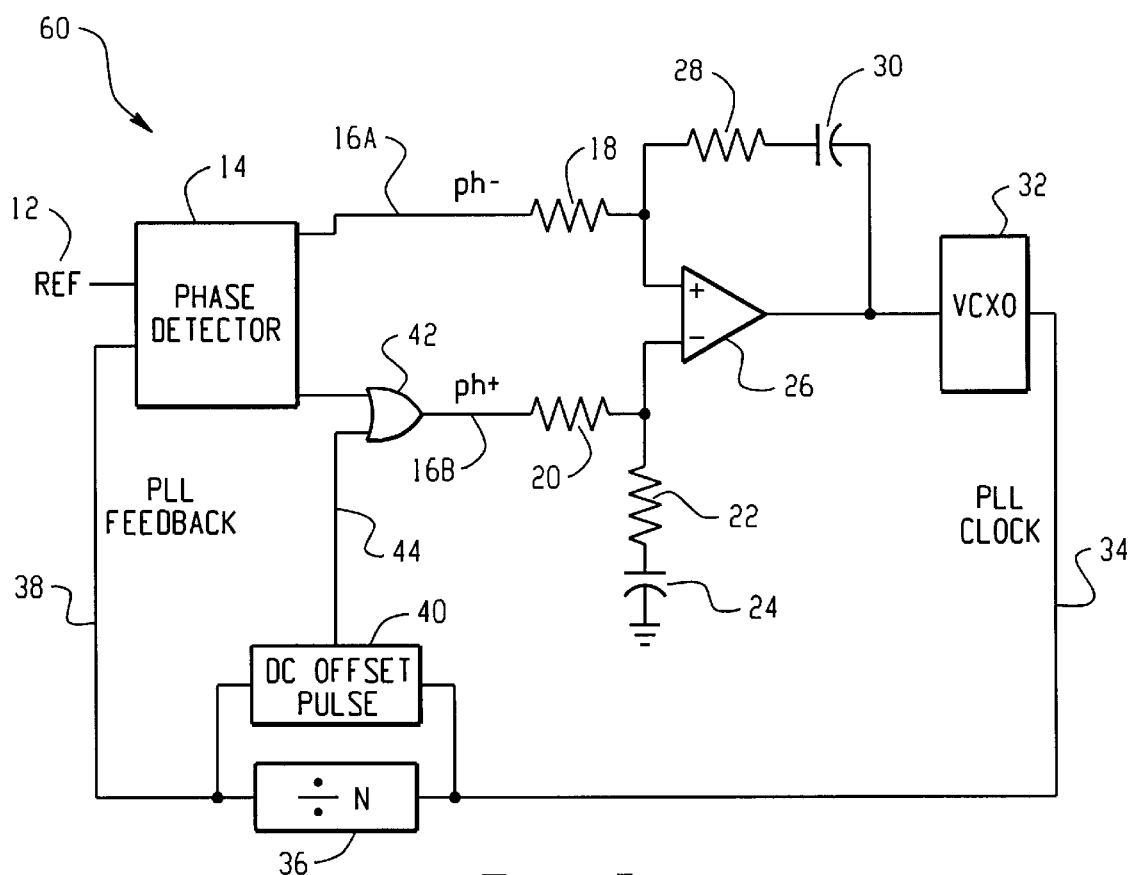
FIG. 5 is a circuit diagram of a second embodiment of a PLL according to the present invention.

FIG. 5 is a circuit diagram of a second embodiment of a PLL according to the present invention. In addition to addressing the dual power supply problem for the operational amplifier 26, the circuit shown in FIG. 5 also addresses the problem of the dead zone of the phase detector 14. The circuit in FIG. 5 is identical to the circuit in FIG. 3, except that the digital pulse signal 44 from the DC offset circuit +40 is only merged with one of the outputs from the phase detector 14. Here, it is shown that the digital pulse signal 44 is merged with the positive phase output 16B of the phase detector 14. Alternatively, it could be merged with the negative phase output 16A.

Initially, this would appear to disrupt the concept of polarizing the inputs of the operational amplifier 26, because the digital pulse signal 44 is only being applied to the positive input of the operational amplifier 26. But because the PLL includes a feedback loop, the circuit will sense the digital pulse signal 44 on the positive phase output 16B, and will attempt to compensate for this apparent phase difference by generating a corresponding digital pulse signal on the negative phase output 16A, thus providing the other polarization pulse for the operational amplifier's 26 negative input. In this manner, both polarization pulses can be generated and applied to the inputs of the operational amplifier 26 using only a single digital pulse 44 integrated with just one of the phase detector outputs 16A, 16B.

Figure 6:
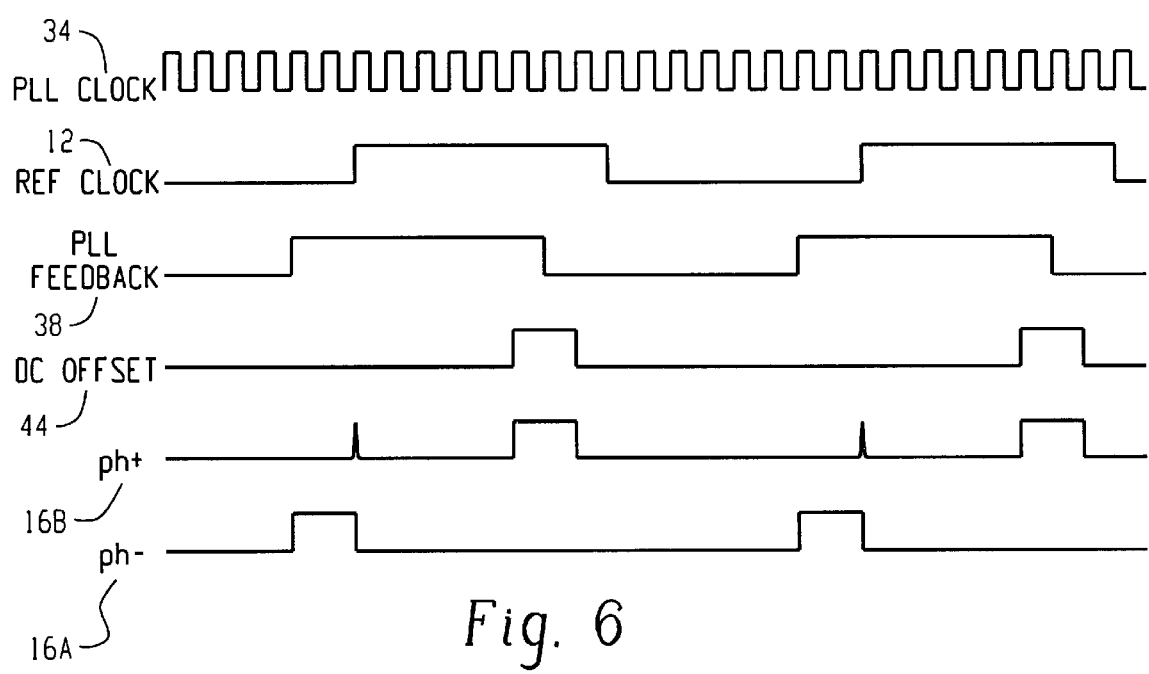
FIG. 6 is a timing diagram showing the operation of the PLL set forth in FIG. 5.

FIG. 6 is a timing diagram showing the operation of the PLL set forth in FIG. 5. This timing diagram shows the PLL clock signal 34, the reference clock signal 12, the PLL feedback signal 38, the digital pulse signal 44, and the positive and negative phase output signals 16A, 16B. Here, the positive phase output signal 16B results from the OR-Ing of the positive output from the phase detector 14 and the digital pulse signal 44.

As shown in this figure, the PLL 10 has locked with a continuous phase error equivalent to the pulse width of the digital pulse signal 44. Because the digital pulse signal 44 is a multiple of the PLL clock signal 34, however, the phase error between the PLL clock signal 34 and the reference clock 12 is zero degrees when the PLL is locked. The digital pulse signal 44 from the DC offset circuit 40 is injected into the positive phase output signal 16B on the falling edge of the PLL feedback signal 38, as previously, but now the digital pulse signal 44 is injected into the negative phase output signal 16A on the rising edge of the PLL feedback signal 38, due to the configuration of the feedback loop.

By configuring the PLL 10 in the manner shown in FIG. 5, the problem of the "dead zone" in the phase detector 14 is eliminated. This occurs because the PLL feedback signal 38 is always out of phase from the reference clock signal 12 by the pulse width of the digital pulse signal 44. When the PLL is locked, the phase difference between the PLL feedback signal 38 and the reference clock signal 12 is no longer zero degrees, thus eliminating the "dead zone" effect in the prior art PLL where the phase difference is near zero degrees when the PLL is locked. This enables the PLL shown in FIG. 5 to discriminate phase differences at a much lower threshold than in the prior art circuit shown in FIG. 1.

The preferred embodiments described with reference to the drawing figures are presented only to demonstrate examples of the invention. This detailed description is not meant to limit the invention in any way. Additional, and/or alternative, embodiments of the invention would be apparent to one of ordinary skill in the art upon reading this disclosure.

What is claimed:

1. A phase locked loop comprising:
   a phase detector coupled to a reference clock signal and a feedback signal for generating positive and negative phase detection signals corresponding to the phase difference between the reference clock signal and the feedback signal;
   in integrator coupled to the positive and negative phase detection signals for converting the positive and negative phase detection signals into an output voltage that is proportional to the phase difference between the reference clock signal and the feedback signal;
   a voltage controlled oscillator coupled to the output voltage of the integrator for generating a local oscillator signal with an oscillation frequency proportional to the output voltage of the integrator;
   a feedback circuit coupled to the local oscillator that shifts the phase of the local oscillator signal to generate the feedback signal;
   wherein the phase locked loop locks with a continuous phase error between the feedback signal and the reference signal that is equivalent to or substantially equivalent to an integer multiple of the period of the local oscillator signal, and wherein the feedback circuit comprises:
      a DC offset pulse generator coupled to the local oscillator signal that generates a DC offset pulse having a pulse width that is an integer multiple of the period of the local oscillator signal; and
      means for merging the DC offset pulse with one of the positive or negative phase detection signals;
      wherein the DC offset pulse shifts the phase of the local oscillator signal by an amount equal to or substantially equal to the pulse width of the DC offset pulse.

2. The phase locked loop of claim 1, wherein the DC offset pulse is centered one hundred and eighty degrees (180°) out of phase with the local oscillator signal.

3. The phase locked loop of claim 1, wherein the pulse width of the DC offset pulse is variable.

4. The phase locked loop of claim 3, wherein the pulse width of the DC offset pulse is varied using a digital variation signal.

5. The phase locked loop of claim 1, wherein the merging means comprises an OR gate.

6. The phase locked loop of claim 1, wherein the feedback circuit further comprises a divider for generating the feedback signal by dividing the frequency of the local oscillator signal.

7. The phase locked loop of claim 6, wherein the divider is characterized by a division ratio N, wherein N is an integer that corresponds to the desired frequency of the local oscillator signal in comparison to the reference clock signal.

8. The phase locked loop of claim 7, wherein the division ratio N is adjustable.

9. The phase locked loop of claim 1, wherein the DC offset pulse also polarizes the positive and negative phase detection signals.

10. An improved phase locked loop having a phase detector that compares the phases of a reference clock signal and a feedback signal and generates a positive and a negative phase detection signal, an integrator coupled to the positive and negative phase detection signals that generates an output voltage as a function of the pulse width of the positive and negative phase detection signals, and a voltage controlled oscillator coupled to the output voltage of the integrator that generates a local oscillator signal, wherein the phase detector is characterized by a phase discrimination dead zone within which the phase detector cannot discriminate between the phase of the reference clock signal and the phase of the feedback signal, the improvement comprising:

a feedback circuit coupled to the local oscillator signal that generates the feedback signal, and that shifts the phase of the local oscillator signal in order to eliminate the discrimination dead zone of the phase detector by causing the phase locked loop to lock with a phase error equivalent to or substantially equivalent to an integer multiple of the period of the local oscillator signal; wherein the feedback circuit comprises:

a DC offset pulse generator that generates a DC pulse having a pulse width that is an integer multiple of the period of the local oscillator signal; and means for merging the DC offset pulse with one of the positive or negative phase detection signals in order to shift the phase of the local oscillator signal.

11. The improved phase locked loop of claim 10, wherein the DC offset pulse generator is coupled to the local oscillator signal.

12. The improved phase locked loop of claim 10, wherein the DC offset pulse is centered one hundred and eighty degrees (180°) out of phase with the local oscillator signal.

13. The improved phase locked loop of claim 10, wherein the merging means is an OR gate.

14. The improved phase locked loop of claim 10, wherein the DC offset pulse also polarizes the positive and negative detection signals.

15. The improved phase locked loop of claim 10, wherein the feedback circuit further comprises a divider for generating the feedback signal by dividing the frequency of the local oscillator signal.

* * * * *